United States Patent
Dussarrat et al.

(10) Patent No.: US 9,121,093 B2
(45) Date of Patent: Sep. 1, 2015

(54) BIS-KETOIMINATE COPPER PRECURSORS FOR DEPOSITION OF COPPER-CONTAINING FILMS AND METHODS THEREOF

(75) Inventors: Christian Dussarrat, Wilmington, DE (US); Clément Lansalot-Matras, Seoul (KR); Vincent M. Omarjee, Grenoble (FR); Andrey V. Korolev, Newark, DE (US)

(73) Assignee: American Air Liquide, Inc., Fremont, CA (US)

( * ) Notice: Subject to any disclaimer, the term of this patent is extended or adjusted under 35 U.S.C. 154(b) by 793 days.

(21) Appl. No.: 13/383,343

(22) PCT Filed: Jul. 9, 2010

(86) PCT No.: PCT/US2010/041471
§ 371 (c)(1),
(2), (4) Date: Aug. 6, 2012

(87) PCT Pub. No.: WO2011/006035
PCT Pub. Date: Jan. 13, 2011

(65) Prior Publication Data
US 2012/0321817 A1 Dec. 20, 2012

Related U.S. Application Data

(60) Provisional application No. 61/224,752, filed on Jul. 10, 2009.

(51) Int. Cl.
C23C 16/18 (2006.01)
C23C 16/50 (2006.01)
C23C 16/455 (2006.01)

(52) U.S. Cl.
CPC ........... *C23C 16/18* (2013.01); *C23C 16/45542* (2013.01); *C23C 16/45553* (2013.01)

(58) Field of Classification Search
CPC .............. C23C 16/18; C23C 16/45553; C23C 16/45542; C23C 16/50
USPC .......................................... 427/569, 576, 250
See application file for complete search history.

(56) References Cited

U.S. PATENT DOCUMENTS

| | | | |
|---|---|---|---|
| 3,594,216 A | 7/1971 | Charles et al. | |
| 6,037,001 A * | 3/2000 | Kaloyeros et al. | 427/250 |
| 6,620,956 B2 | 9/2003 | Chen et al. | |
| 7,034,169 B1 | 4/2006 | Norman | |
| 7,087,774 B2 | 8/2006 | Bradley et al. | |
| 7,268,365 B2 | 9/2007 | Bradley et al. | |
| 8,692,010 B1 * | 4/2014 | Korolev et al. | 556/110 |
| 2004/0102038 A1 * | 5/2004 | Oglesby | 438/674 |
| 2004/0219369 A1 * | 11/2004 | Garg et al. | 428/446 |
| 2005/0003075 A1 | 1/2005 | Bradley et al. | |
| 2005/0107283 A1 | 5/2005 | Bradley et al. | |
| 2005/0181555 A1 * | 8/2005 | Haukka et al. | 438/232 |
| 2005/0267305 A1 | 12/2005 | Bradley et al. | |
| 2006/0141155 A1 | 6/2006 | Gordon et al. | |
| 2008/0044687 A1 | 2/2008 | Bradley et al. | |
| 2008/0075855 A1 * | 3/2008 | Garg et al. | 427/250 |
| 2008/0171890 A1 | 7/2008 | Kim et al. | |
| 2008/0242880 A1 | 10/2008 | Chen et al. | |
| 2009/0042041 A1 | 2/2009 | Grushin | |

FOREIGN PATENT DOCUMENTS

| | | |
|---|---|---|
| DE | 10 2007 058571 | 6/2009 |
| EP | 2 065 364 | 6/2009 |
| JP | 2006 241137 | 9/2006 |
| WO | WO 03 044242 | 5/2003 |
| WO | WO 2010 071364 | 6/2010 |
| WO | WO 2011 006035 | 1/2011 |

OTHER PUBLICATIONS

Turgambaeva, Assia E., et al., "Mass spectrometric study of the thermal decomposition mechanism of vapors of 2,2,6,6-tetramethyl-3-iminoheptane-5-one and its copper(II) complex". Journal of Organometallic Chemistry 692 (2007) 5001-5006.*

Stabnikov, P.A., et al., "Synthesis and properties of a new ketoiminate derivative of the 2,2,6,6 tetramethylheptane-3,5-dionate ligand to prepare voltaile CVD precursors". Polyhedron 26 (2007) 4445-4450.*

Condorelli, Guglielmo, et al., "Nucleation and Growth of Copper Oxide Films in MOCVD Processes Using the B-Ketoiminate Precursor 4,4'-(1,2-Ethanediyldinitrilo)bis(2-pentanonate) Copper(II)". Chemical Vapor Deposition, 1999, 5, No. 5, pp. 237-244.*

Aaltonen, T. et al., "Atomic layer deposition of noble metals—exploration of the low limit of the deposition temperature," Journal of Material Research, vol. 19, No. 11, Nov. 2004, pp. 3353-3358.

Becht, M. et al., "Nickel thin films grown by MOCVD using (Ni(dmg)$_2$ as precursor," Journal de Physique IV, Colloque C5, Supplement to Journal de Physique II, vol. 5, Jun. 1995, pp. C5-465 to C5-472.

Han, B. et al., "Atomic layer deposition of copper thin film using Cu(II)diketoiminate$_2$ and H$_2$," Proceedings of the 2009 IEEE International Interconnect Technology Conference, Jun. 19, 2009, pp. 173-174.

Holme, T.P. et al., "Atomic layer deposition and chemical vapor desposition precursors selection method application to strontium and barium precursors," Journal of Physical Chemistry A, published on the internet Jul. 27, 2007, pp. A-E.

Liu, Y-H et al., "Synthesis and characterization of fluorinated βketoiminate and imino-alcohate Pd complexes—precursors for palladium chemical vapor deposition," Journal of Materials Chemistry, 2003, 13, opp. 135-142.

(Continued)

*Primary Examiner* — Bret Chen
(74) *Attorney, Agent, or Firm* — Patricia E. McQueeney

(57) ABSTRACT

Disclosed are processes for the use of bis-ketoiminate copper precursors for the deposition of copper-containing films via Plasma Enhanced Atomic Layer Deposition (PEALD) or Plasma Enhanced Chemical Vapor Deposition (PECVD).

10 Claims, 6 Drawing Sheets

(56) References Cited

OTHER PUBLICATIONS

Mao, J. et al., "Scaling of copper seed layer thickness using plasma-enhanced ALD and an optimized precursor," Proceedings of the IEEE/SEMI Advanced Semiconductor Manufacturing Conference, Saratoga Springs, New York, New York, May 15-18, 2011, no page #s.

Mao, J. et al., "Ultra-low temperature deposition of copper seed layers by PEALD" Abstract, Proceedings of the 218$^{th}$ ECS Meeting, Las Vegas, Nevada, Oct. 10-15, 2010, no page #s.

Utriainen, M. et al., "Studies of NiO thin film formation by atomic layer epitaxy," Materials Science and Engineering B54 (1998) pp. 98-103.

Wu, L. et al., "Effects of hydrogen plasma treatments on the atomic layer deposition of copper," Electrochemical and Solid-States Letters (2008), 11(5), H107-H110.

Wu, L. et al., "Hydrogen plasma-enhanced atomic layer deposition of copper thin films," Journal of Vacuum Science and Technology, Part B, vol. 25, No. 6, Dec. 11, 2007, pp. 2581-2585.

Zharkova, G.I. et al., "New volatile complexes of Ni(II) and Pd(II) with 2,2,6,6-tetramethyul-3-amino-4-hepten-5-one-structure and properties," Journal of Structural Chemistry, 2008, vol. 49, No. 2, pp. 309-316.

International Search Report and Written Opinion for co-pending PCT/US2010/041471, Feb. 10, 2011.

Basato, M. et al., "Coordinating properties of the anionic ligand (MeCO)2C(−)C(X)Me (X=O or NH)," Inorganica Chimica Acta 362 (2009), 2551-2555.

Doppelt, P., "Why is coordination chemistry stretching the limits of micro-electronics technology?," Coordination Chemistry Reviews 178-180 (1998), 1785-1809.

Everett, G.W. et al., "The synthesis and proton resonance study of the solution equilibria of bis(β-ketoamino) nickel(II) complexes," Journal of the American Chemical Society (1965), 87(10), 2117-27.

Everett, G.W. et al., "Existence of the planar [UNK] tetrahedral equilibrium in solutions of cobalt(II) complexes," J. Am. Chem. Soc., 1965, 87 (22), 5266-5267.

Hitchcock, P.B. et al., "Synthesis and structures of the transition metal(II) β-diketiminates [ML$_2$] (M=Mn, Fe, Ni, Cu, Pd), [ML'2](M=Ni, CU) and [M($\eta^3$—C$_3$H$_5$)L](M=Ni, Pd): L or L'=[[N(SiMe$_3$ or H)C(Ph)]$_2$ CH]," Journal of Organometallic Chemistry, 2009, vol. 694, 667-676.

Huo, J. et al., "Characteristics of copper films produced via atomic layer deposition," Journal of Material Research, vol. 17, No. 9, Sep. 2002, 2394-2398.

Martensson, P. et al., "Atomic layer epitaxy of copper: Growth and selectivity on the Cu(II) -2,2,6,6-tetramethyl-3,5-heptanedionate/H$_2$ Process," Journal of the Electrochemical Society, vol. 145, No. 8, Aug. 1998, 2926-2931.

Martensson, P. et al., "Use of atomic layer epitaxy for fabrication of Si—TiN—Cu structures," Journal of Vacuum Science and Technology B, 17(5), Sep./Oct. 1999, 2122-2128.

Norman, J.A.T. et al., "New precursors for CVD copper metallization," Microelectronic Engineering 85 (2008), 2159-2163.

Osowole, A.A. et al., "Synthesis and characterisation of some nickel(II) beta-ketoamines and their adducts with 2,2' bipyridine and 1/10-phenanthroline," Synthesis and Reactivity in Inorganic and Metal-Organic Chemistry (2002), 32(4), 783-799.

Park, K.-H. et al., Remarkably volatile copper(II) complexes of N,N2-unsymmetrically substituted 1,3-diketimines as precursors for Cu metal deposition via CVD or ALD, Journal of the American Chemical Society 2005, 127, 9330-9331.

Park, J.W. et al., "Synthesis of Cu(II) aminoalkoxide complexes and their unusual thermolysis to Cu(0)," Inorganic Chemistry Communications 7 (2004), 463-466.

Senocq, F. et al., "Thermal behaviour of CpCuPEt3 in gas phase and Cu thin films processing," Surface & Coatings Technology 201 (2007), 9131-9134.

Solanki, R. et al., "Atomic layer deposition of copper seed layers," Electrochemical and Solid-State Letters, 3 (10) 2000, 479-480.

Stabnikov, P.A. et al., "Saturated vapor pressure and crystal structure of bis-(2-imino-4-pentanonato)copper(II)," Journal of Structural Chemistry, 2003, vol. 44, No. 6, 1054-1061.

Yoshida, E. et al., "Palladium(II) complexes of beta-ketoamines derived from acetylacetone and amines," Bulletin of the Chemical Society of Japan (1965), 38(12), 2179-82.

Zharkova, G.I. et al., "Synthesis, properties and crystal structures of volatile beta-ketomiminate Pd complexes, precursors for palladium chemical vapor deposition," Polyhedron 28 (2009), 2307-2312.

International Search Report and Written Opinion for related PCT/US2010/041518, Oct. 7, 2010.

\* cited by examiner

BIS-KETOIMINATE COPPER PRECURSORS FOR DEPOSITION OF COPPER-CONTAINING FILMS AND METHODS THEREOF

This application is a 371 of International PCT Application PCT/US2010/041471, filed Jul. 9, 2010, which claims priority to U.S. provisional application No. 61/224,752, filed Jul. 10, 2009, the entire contents of each being incorporated herein by reference.

BACKGROUND

Copper has displaced aluminum to become the standard back-end-of-line (BEOL) metallization material for advanced logic devices. Copper's benefits over aluminum for logic are now well-documented. Its lower resistivity allows line thickness to be reduced by nearly one-third while achieving similar sheet resistance.

The formation of copper containing films via Chemical Vapor and Atomic Layer Deposition (CVD and ALD) are promising. Desirable properties of the copper precursor for these applications are: i) high volatility, ii) sufficient stability to avoid decomposition during handling and delivery, and iii) appropriate reactivity. For industrial process reasons, deposition of copper should be realized at low temperature, below 150° C., which makes deposition of copper particularly challenging.

PEALD and PECVD are promising techniques to produce high purity and high-density metal thin films at low growth temperatures.

E. Eisenbraun et al. *J. Vac. Sci. Technol.* B 25, 6, 2007 and Eisenbraun, E. *Electrochemical and Solid-State Letters*, 11, 5, H107-H110, 2008 describe the deposition of copper by PEALD using $Cu(acac)_2$ and hydrogen as reductant. Continuous and pure films (95% purity) were obtained on TaN, $SiO_2$ and Ru in a temperature range between 85 and 135° C. Moreover conformal depositions have been achieved over high aspect ratio (5:1) structures.

Until now, PEALD and PECVD have never been considered as possible for the deposition of pure copper with copper bis-ketoiminate precursors.

SUMMARY

Disclosed are methods of forming a copper-containing film on one or more substrates in a reactor. A copper-containing precursor having the following formula is introduced into the reactor:

Compound (I)

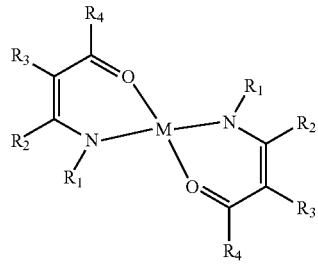

(I)

wherein:
1) M is Cu; and
2) each $R^1$, $R^2$, $R^3$, and $R^4$ is independently selected from the group consisting of H, a $C_1$-$C_5$ alkyl, an alkyl amino group, and $Si(R')_3$ where each R' is independently selected from H and a $C_1$-$C_5$ alkyl group A co-reactant is introduced into the reactor. The co-reactant is treated with a plasma to form a plasma-treated co-reactant. The precursor and the plasma-treated co-reactant react to form a copper-containing film on the substrate. The disclosed methods may include one or more of the following aspects:
- maintaining the reactor at a temperature between about 50° C. to about 600° C.;
- maintaining the reactor at a pressure between about 0.5 mTorr and about 20 Torr;
- generating the plasma with a power ranging from about 50 W to about 500 W;
- treating the co-reactant with the plasma occurs prior to introduction of the co-reactant into the reactor;
- the co-reactant being selected from the group consisting of $H_2$, $NH_3$, $SiH_4$, $Si_2H_6$, $Si_3H_8$, $SiH_2Me_2$, $SiH_2Et_2$, $N(SiH_3)_3$, and mixtures thereof;
- the copper-containing precursor and the co-reactant being introduced into the chamber sequentially;
- the co-reactant being introduced prior to the copper-containing precursor;
- the precursor being selected from the group consisting of:
  bis(4N-(amino)pent-3-en-2-onato)Copper(II),
  bis(4N-(methylamino)pent-3-en-2-onato)Copper(II),
  bis(4N-(ethylamino)pent-3-en-2-onato)Copper(II),
  bis(4N-(isopropylamino)pent-3-en-2-onato)Copper(II),
  bis(4N-(n-propylamino)pent-3-en-2-onato)Copper(II),
  bis(4N-(n-butylamino)pent-3-en-2-onato)Copper(II),
  bis(4N-(isobutylamino)pent-3-en-2-onato)Copper(II),
  bis(4N-(secbutylamino)pent-3-en-2-onato)Copper(II), and
  bis(4N-(tertbutylamino)pent-3-en-2-onato)Copper(II);
- the precursor being bis(4N-(ethylamino)pent-3-en-2-onato)Copper(II); and
- the copper-containing film being formed on the substrate at a rate ranging from 0.1 to 1.0 angstroms/cycle.

Also disclosed are copper-containing thin film coated substrates comprising the product of the disclosed methods.

Also disclosed are methods of synthesizing bis-ketoiminato copper precursors having the structure:

Compound (I)

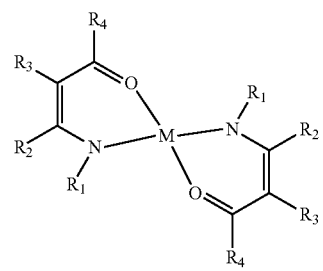

wherein M is Cu and each of $R^1$, $R^2$, $R^3$, and $R^4$ are independently selected from the group consisting of H, a $C_1$-$C_5$ alkyl, an alkyl amino group, and $Si(R')_3$ where R' is selected from H and a $C_1$-$C_5$ alkyl group. The method comprises reacting a copper alkoxide ($Cu(OR^5)_2$), wherein $R^5$ is selected from the group consisting of methyl, ethyl, and isopropyl, with two equivalents of a ketoimine ligand ($R^4C(=O)C(R^3)=C(NHR^1)R^2$) in a solvent selected from the group consisting of alcohol, tetrahydrofuran, diethylether, and toluene.

Scheme-1

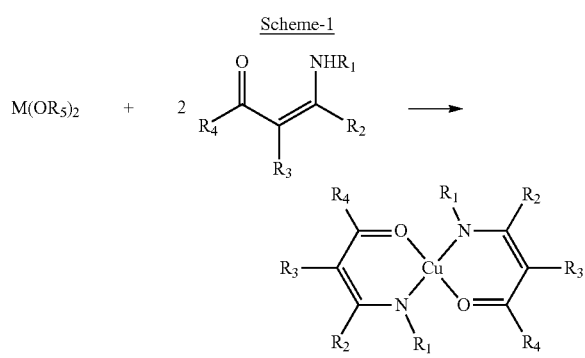

The disclosed methods may include one or more of the following aspects:
- removing the solvent;
- adding an alkane solvent to form a solution;
- filtering the solution;
- removing the alkane solvent to form the bis-ketoiminato copper precursor; and
- distilling the bis-ketoiminato copper precursor.

Notation and Nomenclature

Certain terms are used throughout the following description and claims to refer to various components and constituents.

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, isopropyl groups, t-butyl groups, etc. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "iPr" refers to an isopropyl group; and the abbreviation "t-Bu" refers to a tertiary butyl group.

The standard abbreviations of the elements from the periodic table of elements are used herein. It should be understood that elements may be referred to by these abbreviations (e.g., Cu refers to copper, Ni refers to nickel, Pd refers to palladium, Co refers to cobalt, etc).

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

BRIEF DESCRIPTION OF THE FIGURES

For a further understanding of the nature and objects of the present invention, reference should be made to the following detailed description, taken in conjunction with the accompanying drawings, wherein.

DESCRIPTION OF PREFERRED EMBODIMENTS

Figure 1:
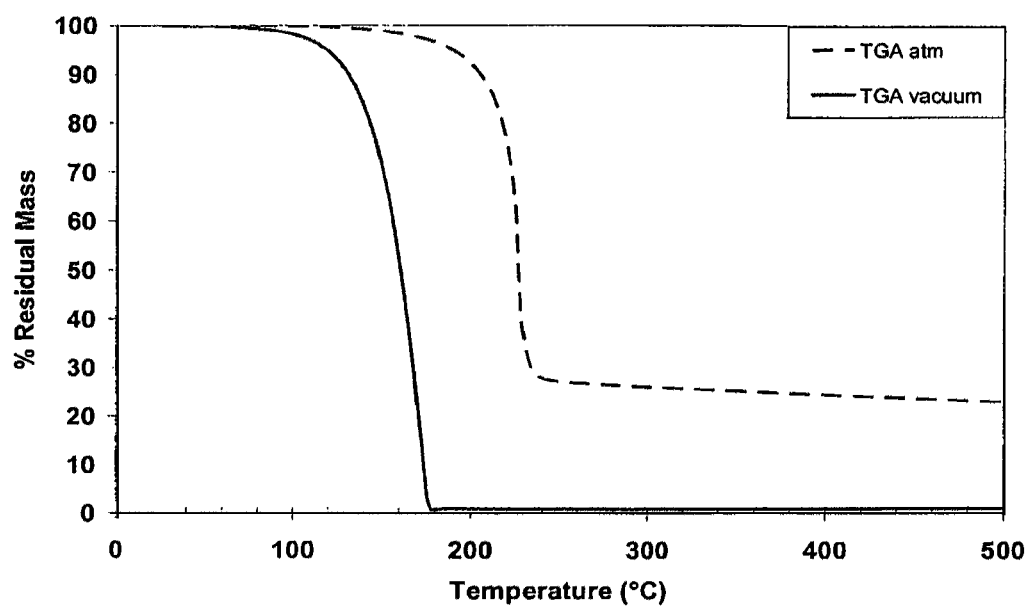
FIG. 1 is a graph of the percent residual mass of bis(4N-(ethylamino)pent-3-en-2-onato)Copper(II) as a function of temperature during open-cup Thermo-Gravimetric Analysis (TGA) under atmospheric and vacuum conditions.

Disclosed herein are non-limiting embodiments of methods, apparatus, and compounds which may be used in the manufacture of semiconductor, photovoltaic, LCD-TFT, or flat panel type devices. More specifically, disclosed are bis-ketoiminate copper precursors and methods for utilizing the same.

The disclosed copper-containing precursors, also interchangeably referred to as bis-ketoiminate copper precursors, have the general formula:

Compound (I)

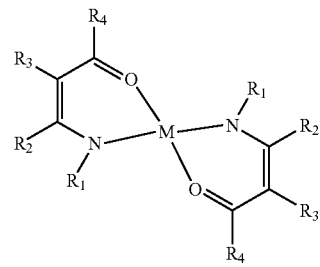

wherein M is Cu and each $R^1$, $R^2$, $R^3$, and $R^4$ is independently selected from H, a $C_1$-$C_5$ alkyl group, an alkyl amino group, and $Si(R')_3$ wherein each R' is independently selected from H and a $C_1$-$C_5$ alkyl group. Preferably $R^1$=Et, $R^2$ and $R^4$=Me, and $R^3$=H.

Examples of bis-ketoiminate copper precursors include bis(4N-(amino)pent-3-en-2-onato)Copper(II), bis(4N-(methylamino)pent-3-en-2-onato)Copper(II), bis(4N-(ethylamino)pent-3-en-2-onato)Copper(II), bis(4N-(isopropylamino)pent-3-en-2-onato)Copper(II), bis(4N-(n-propylamino)pent-3-en-2-onato)Copper(II), bis(4N-(n-butylamino)pent-3-en-2-onato)Copper(II), bis(4N-(isobutylamino)pent-3-en-2-onato)Copper(II), bis(4N-(secbutylamino)pent-3-en-2-onato)Copper(II), and bis(4N-(tertbutylamino)pent-3-en-2-onato)Copper(II).

bis(4N-(amino)pent-3-en-2-onato)Copper(II) may be prepared as described in the literature (P. A. Stabnikov, J. Struc-

*tural Chemistry* 2003, 44, 6, 1054-1061) by reacting copper acetate ($Cu(OAc)_2$) with the ketoimine ligand in aqueous alcohol in the presence of excess ammonia. Other copper precursors, bis(4N—(R-amino)pent-3-en-2-onato)Copper (II), may be prepared either by reacting $CuCl_2$ or $CuBr_2$ with two equivalents of the lithium salt of the R-ketoimine ligand in tetrahydrofuran, or by reacting $Cu(OMe)_2$ or $Cu(OEt)_2$ with two equivalents of R-ketoimine ligand in alcohol (MeOH or EtOH).

The bis-ketoiminate copper precursor may be used to deposit a pure copper, copper silicate ($Cu_kSi_l$), copper oxide ($Cu_nO_m$) or copper oxynitride ($Cu_xN_yO_z$) film, wherein k, l, m, n, x, y, and z are integers which inclusively range from 1 to 6. These types of films may be useful in Resistive Random Access Memory (ReRAM) type applications. Some typical film types include a copper film and CuO film. Using the disclosed precursors and methods, the copper-containing film is formed on the substrate at a rate ranging from 0.1 to 1.0 angstroms/cycle.

The thin film may be deposited from the disclosed precursors using any plasma enhanced deposition methods known to those of skill in the art. Examples of suitable deposition methods include without limitation, Plasma Enhanced Chemical Vapor Depositions (PECVD), pulse PECVD, Plasma Enhanced Atomic Layer Deposition (PE-ALD), or combinations thereof. The plasma processes may utilize direct or remote plasma sources.

Use of these plasma processes allows the deposition at lower temperatures of films having higher density, which is critical to deposition of a thin, continuous film such as copper. Additionally, the nucleation process and microstructure of the resulting films are much less sensitive to the condition of the substrate surface than in a thermal ALD process. In other words, the plasma process may allow depositions on substrates that previously proved inefficient using the thermal ALD process. Finally, the plasma process may provide an increase in the deposition rate and form a more pure film than those produced by thermal ALD.

The bis-ketoiminate copper precursor may be supplied either in neat form or in a blend with a suitable solvent, such as ethyl benzene, xylenes, mesitylene, decane, dodecane. The bis-ketoiminate copper precursor may be present in varying concentrations in the solvent.

The neat or blended bis-ketoiminate copper precursor is introduced into a reactor in vapor form. The precursor in vapor form may be produced by vaporizing the neat or blended precursor solution through a conventional vaporization step such as direct vaporization, distillation, or by bubbling. The neat or blended bis-ketoiminate copper precursor may be fed in liquid state to a vaporizer where it is vaporized before it is introduced into the reactor. Alternatively, the neat or blended bis-ketoiminate copper precursor may be vaporized by passing a carrier gas into a container containing the bis-ketoiminate copper precursor or by bubbling the carrier gas into the bis-ketoiminate copper precursor. The carrier gas may include, but is not limited to, Ar, He, $N_2$, and mixtures thereof. Bubbling with a carrier gas may also remove any dissolved oxygen present in the neat or blended precursor solution. The carrier gas and bis-ketoiminate copper precursor are then introduced into the reactor as a vapor.

If necessary, the container of bis-ketoiminate copper precursor may be heated to a temperature that permits the bis-ketoiminate copper precursor to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of bis-ketoiminate copper precursor vaporized.

The reactor may be any enclosure or chamber within a device in which deposition methods take place such as, and without limitation, a parallel-plate type reactor, a cold-wall type reactor, a hot-wall type reactor, a single-wafer reactor, a multi-wafer reactor, or other types of deposition systems under conditions suitable to cause the precursors to react and form the layers.

The reactor contains one or more substrates onto which the thin films will be deposited. The one or more substrates may be any suitable substrate used in semiconductor, photovoltaic, flat panel or LCD-TFT device manufacturing. Examples of suitable substrates include without limitation silicon substrates, silica substrates, silicon nitride substrates, silicon oxy nitride substrates, tungsten substrates, titanium nitride, tantalum nitride, or combinations thereof. Additionally, substrates comprising tungsten or noble metals (e.g. platinum, palladium, rhodium or gold) may be used. The substrate may also have one or more layers of differing materials already deposited upon it from a previous manufacturing step.

The temperature and the pressure within the reactor are held at conditions suitable for PE-ALD, PECVD, or pulse PECVD depositions. For instance, the pressure in the reactor may be held between about 0.5 mTorr and about 20 Torr, preferably between about 0.2 Torr and 10 Torr, and more preferably between about 1 Torr and 10 Torr, as required per the deposition parameters. Likewise, the temperature in the reactor may be held between about 50° C. and about 600° C., preferably between about 50° C. and about 250° C., and more preferably between about 50° C. and about 100° C.

In addition to the bis-ketoiminate copper precursor, a co-reactant is introduced into the reactor. The co-reactant may be an oxidizing gas, such as oxygen, ozone, water, hydrogen peroxide, nitric oxide, nitrogen dioxide, as well as mixtures of any two or more of these. Alternatively, the co-reactant may be a reducing gas, such as hydrogen, ammonia, a silane (e.g. $SiH_4$, $Si_2H_6$, $Si_3H_8$), an alkyl silane containing a Si—H bond (e.g. $SiH_2Me_2$, $SiH_2Et_2$), $N(SiH_3)_3$, as well as mixtures of any two or more of these. Preferably, the co-reactant is $H_2$ or $NH_3$.

The co-reactant is treated by a plasma, in order to decompose the co-reactant into its radical form. For instance, the plasma may be generated with a power ranging from about 50 W to about 500 W, preferably from about 100 W to about 200 W. The plasma may be generated or present within the reactor itself. Alternatively, the plasma may generally be at a location removed from the reaction chamber, for instance, in a remotely located plasma system. In this alternative, the co-reactant is treated with the plasma prior to introduction into the reactor. One of skill in the art will recognize methods and apparatus suitable for such plasma treatment.

The bis-ketoiminate copper precursor and the plasma-treated co-reactant react to form a copper-containing film on the substrate. Applicants believe that plasma-treating the co-reactant provides the co-reactant with the energy needed to react with the bis-ketoiminate copper precursor at lower temperatures.

Depending on what type of film is desired to be deposited, a second precursor may be introduced into the reactor. The second precursor may be another metal source, such as manganese, ruthenium, titanium, tantalum, bismuth, zirconium, hafnium, lead, niobium, magnesium, aluminum, lanthanides, or mixtures of these. Where a second metal-containing precursor is utilized, the resultant film deposited on the substrate may contain at least two different metal types.

The bis-ketoiminate copper precursor, the co-reactants, and any optional precursors may be introduced into the reactor simultaneously (PECVD), sequentially (PE-ALD), or in other combinations. The precursor and the co-reactant may be mixed together to form a co-reactant/precursor mixture, and then introduced to the reactor in mixture form. Alternatively, the precursor and co-reactant may be sequentially introduced into the reaction chamber and purged with an inert gas between the introduction of the precursor and the introduction of the co-reactant. For example, the bis-ketoiminate copper precursor may be introduced in one pulse and two additional metal sources may be introduced together in a separate pulse [modified PE-ALD]. Alternatively, the reactor may already contain the co-reactant species prior to introduction of the bis-ketoiminate copper precursor, the introduction of which may optionally be followed by a second introduction of the co-reactant species. In another alternative, the bis-ketoiminate copper precursor may be introduced to the reactor continuously while other metal sources are introduced by pulse (pulse PECVD). In each example, a pulse may be followed by a purge or evacuation step to remove excess amounts of the component introduced. In each example, the pulse may last for a time period ranging from about 0.01 seconds to about 10 seconds, alternatively from about 0.3 seconds to about 5 seconds, alternatively from about 0.5 seconds to about 2 seconds.

Depending on the particular process parameters, deposition may take place for a varying length of time. Generally, deposition may be allowed to continue as long as desired or necessary to produce a film with the necessary properties. Typical film thicknesses may vary from several hundred angstroms to several hundreds of microns, depending on the specific deposition process. The deposition process may also be performed as many times as necessary to obtain the desired film.

In one non-limiting exemplary PE-ALD type process, the vapor phase of a bis-ketoiminate copper precursor is introduced into the reactor, where it is contacted with a suitable substrate. Excess bis-ketoiminate copper precursor may then be removed from the reactor by purging and/or evacuating the reactor. A reducing gas (for example, $H_2$) is introduced into the reactor under plasma power where it reacts with the absorbed bis-ketoiminate copper precursor in a self-limiting manner. Any excess reducing gas is removed from the reactor by purging and/or evacuating the reactor. If the desired film is a copper film, this two-step process may provide the desired film thickness or may be repeated until a film having the necessary thickness has been obtained.

Alternatively, if the desired film is a bimetal film, the two-step process above may be followed by introduction of the vapor of a metal-containing precursor into the reactor. The metal-containing precursor will be selected based on the nature of the bimetal film being deposited. After introduction into the reactor, the metal-containing precursor is contacted with the substrate. Any excess metal-containing precursor is removed from the reactor by purging and/or evacuating the reactor. Once again, a reducing gas may be introduced into the reactor to react with the metal-containing precursor. Excess reducing gas is removed from the reactor by purging and/or evacuating the reactor. If a desired film thickness has been achieved, the process may be terminated. However, if a thicker film is desired, the entire four-step process may be repeated. By alternating the provision of the bis-ketoiminate copper precursor, metal-containing precursor, and co-reactant, a film of desired composition and thickness can be deposited.

The copper-containing films or copper-containing layers resulting from the processes discussed above may include a pure copper, copper silicate ($Cu_kSi_l$), copper oxide ($Cu_nO_m$), or copper oxynitride ($M_xN_yO_z$) film wherein k, l, m, n, x, y, and z are integers which inclusively range from 1 to 6. Preferably, the copper-containing films are selected from a copper film and CuO film. One of ordinary skill in the art will recognize that by judicial selection of the appropriate bis-ketoiminate copper precursor, optional metal-containing precursors, and co-reactant species, the desired film composition may be obtained.

EXAMPLES

The following non-limiting examples are provided to further illustrate embodiments of the invention. However, the examples are not intended to be all inclusive and are not intended to limit the scope of the inventions described herein.

Example 1

Synthesis of copper-bis(ethylamino-3-penten-2-onate)

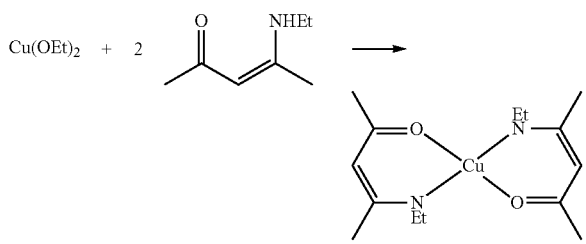

8.3 g (65.1 mmol) of ethyl-enaminoketone was introduced in a 100 mL schlenk flask with 50 mL of MeOH and 5.0 g (32.5 mmol) of Cu(OEt)$_2$ at room temperature. Color immediately turned to dark. The mixture was allowed to stir 1 night at room temperature. The solvent was removed under vacuum. Pentane was added (~40 mL). The solution was filtered over celite. Pentane was removed under vacuum to yield a dark liquid. It was then distilled: A first fraction of the unreacted mixture was removed bp: ~30° C./30 mTorr, uncolored liquid. The second fraction was a dark liquid bp~105-110° C./45 mTorr, 5.49 g/17.4 mmol/53%.

Figure 2:
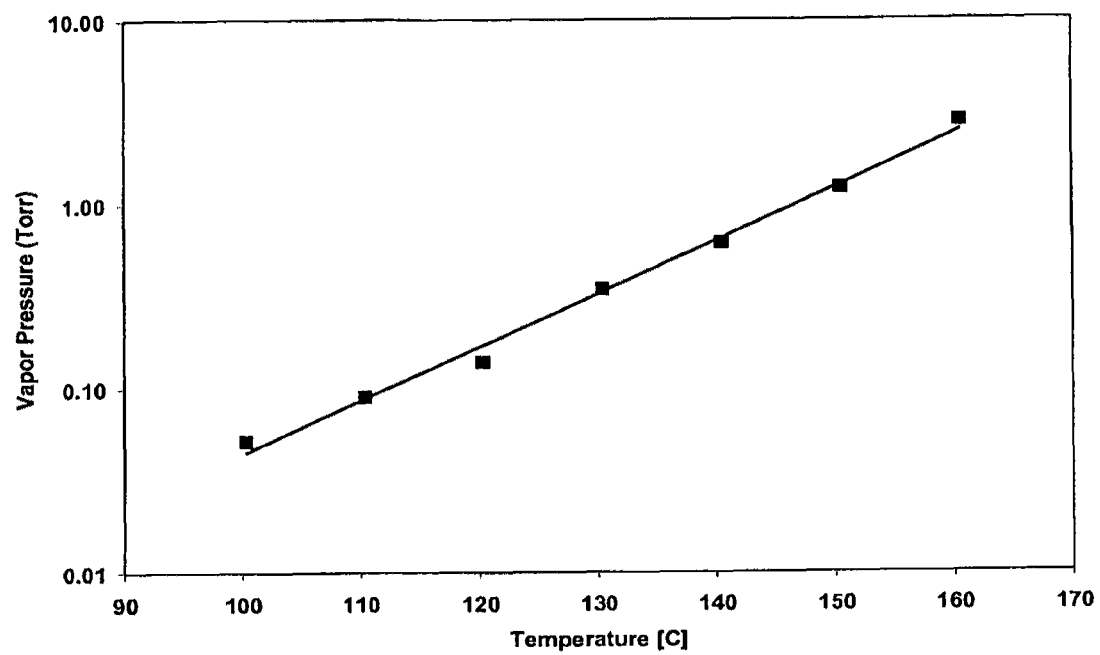
FIG. 2 is a graph of the vapor pressure of bis(4N-(ethylamino)pent-3-en-2-onato)Copper(II) as a function of temperature measured by isothermal evaporation under atmospheric pressure.

A smooth mass loss and single step transition without any inflection points is observed in Thermal Gravimetric Analysis (TGA) (see FIG. 1). While relatively high residue level (~23%) is observed at high temperature (>250° C.) under atmospheric pressure condition, vacuum experiment demonstrates complete evaporation without any detectable residue.

bis(4N-(ethylamino)pent-3-en-2-onato)Copper(II) demonstrates a good volatility, achieving a vapor pressure of 1 Torr at ~145° C. (see FIG. 2) making it suitable for use in vapor deposition processes. Moreover, its room-temperature liquid state gives the precursor an additional advantage in manufacturing applications.

Figure 3:
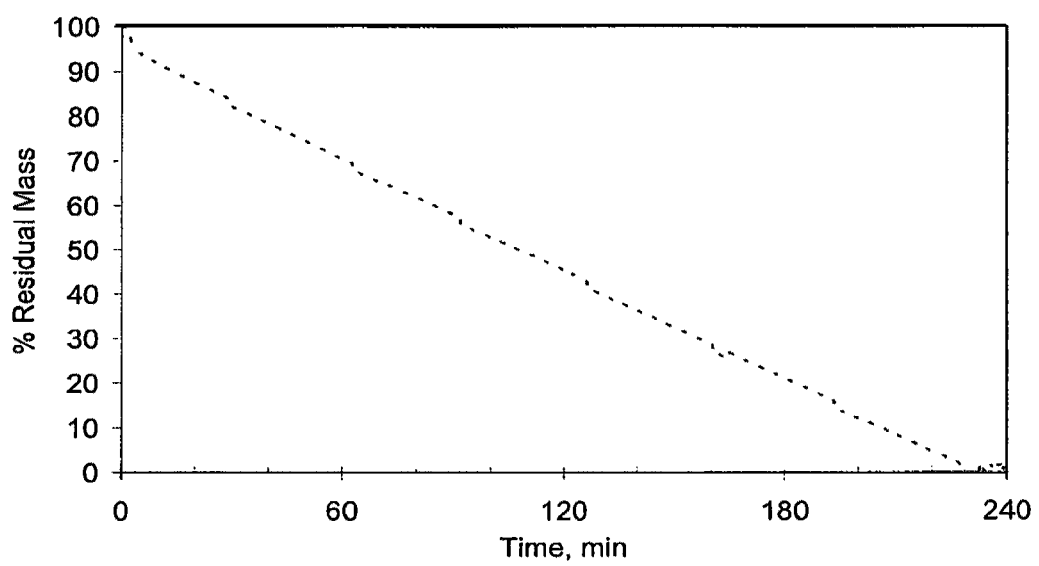
FIG. 3 is an isothermal evaporation graph of the percent residual mass of bis(4N-(ethylamino)pent-3-en-2-onato) Copper(II) at 120° C. over a period of 4 hours under atmospheric pressure.

Thermal stability of bis(4N-(ethylamino)pent-3-en-2-onato)Copper(II) was assessed by monitoring its evaporation at constant temperature of 120° C. in atmospheric pressure TGA conditions (see FIG. 3). Linear mass loss over ~4 hour period with no residue indicating complete evaporation of precursor without noticeable decomposition was observed.

Example 2

PEALD Using bis(4N-(ethylamino)pent-3-en-2-onato)Copper(II)

PEALD tests were performed using bis(4N-(ethylamino) pent-3-en-2-onato)Copper(II), which was heated to 100° C.

in the delivery vessel and introduced into the reactor chamber with the 40 sccm flow of helium carrier gas. The reactor pressure was in the range of 1.7-2.3 torr. Plasma power was set in a range of 80-160 W, and the reactor temperature was set in the range of 60-100° C. The PEALD cycle consisted of 5 second precursor pulse followed by 5 second purge followed by 10 second hydrogen plasma pulse (300 sccm hydrogen flow) and 5 second purge. Pure copper films were deposited on ruthenium, tantalum nitride, titanium nitride and silicon oxide substrates at rates ranging from approximately 0.2 to approximately 0.8 angstroms/cycle.

Figure 4:
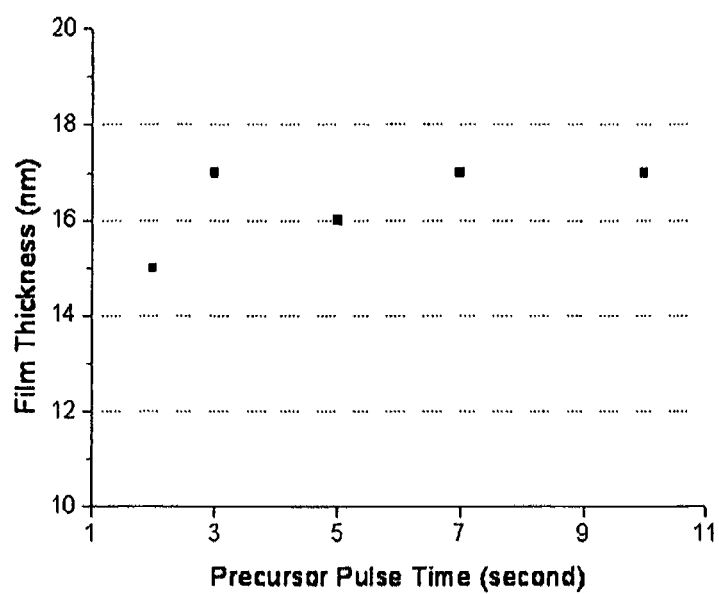
FIG. 4 is a graph of PEALD Cu thickness resulting from 750 cycle depositions as a function of bis(4N-(ethylamino) pent-3-en-2-onato)Copper(II) precursor pulse time at 60° C.

To determine complete precursor saturation on the substrate surface using testing parameters of 120 W plasma and 60° C. reactor temperature, copper films were deposited on silicon oxide substrates using precursor pulses varying from 2 to 10 seconds. FIG. 4 is a graph of the resulting Cu film thickness as a function of precursor pulse time resulting from 750 cycles. For all precursor pulses, deposition rates higher than 0.20 Å/cycle were obtained at 60° C. At a precursor pulse time of three seconds, complete surface saturation is achieved.

Figure 5:
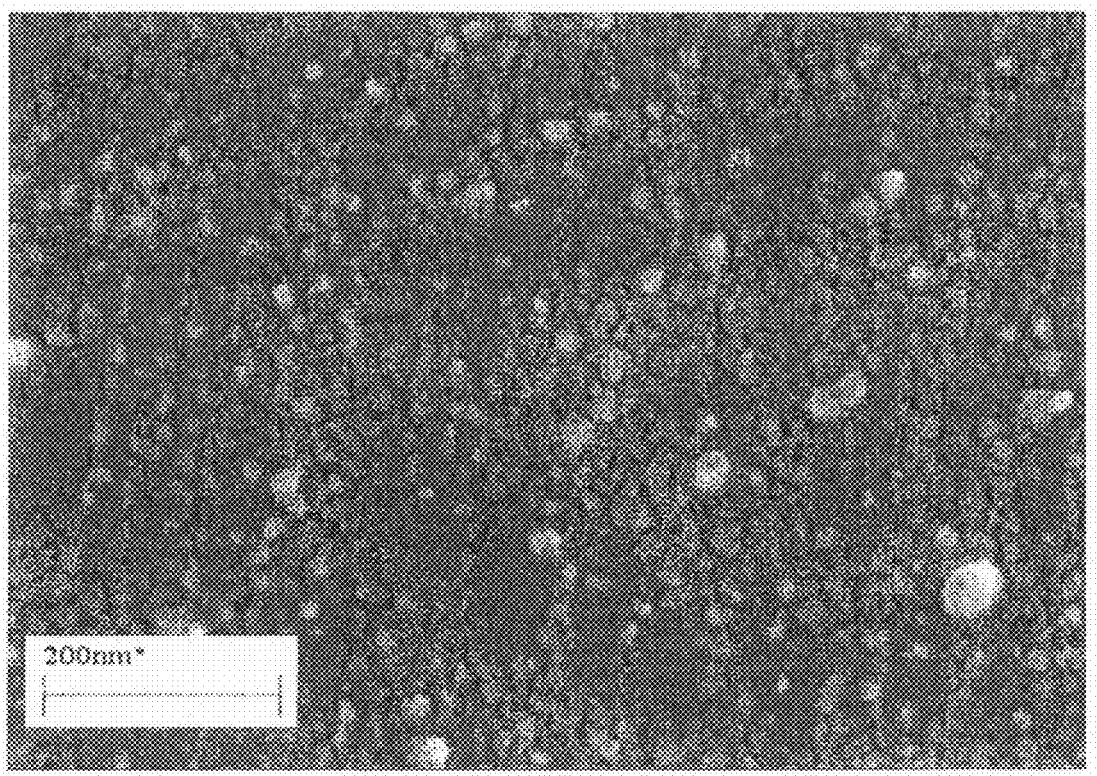
FIG. 5 is a scanning electron microscopy (SEM) photograph showing the surface microstructure of PEALD Cu films grown at 60° C. using bis(4N-(ethylamino)pent-3-en-2-onato)Copper(II)

Auger Electron Spectroscopy (AES) of a copper film produced from the PEALD process described above using 120 W plasma, 60° C. reactor temperature, and 5 second precursor pulse showed no carbon or nitrogen incorporation into the film. Scanning Electron Microscopy (SEM) of the surface microstructure of the same copper film showed a surface (~17 nm thick) with uniform and smooth grains, and with good continuity (see FIG. 5).

Figure 6:
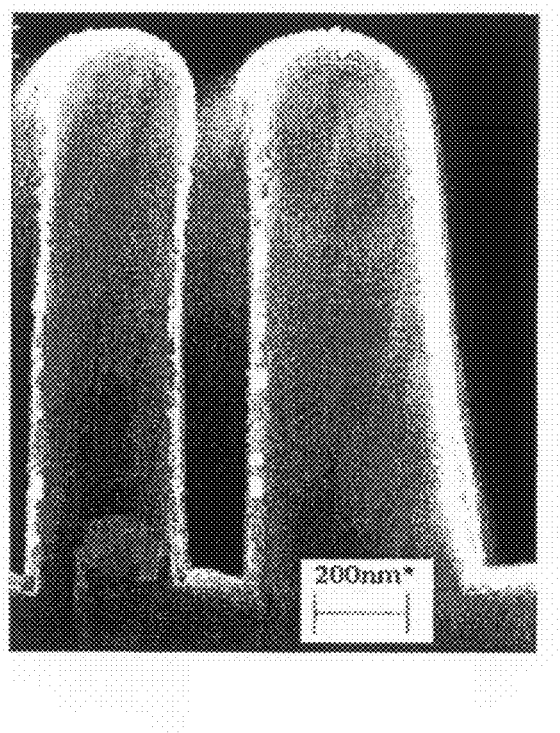
FIG. 6 is a cross-section SEM photograph showing conformality of a ~40 nm thick PEALD Cu film deposited with (4N-(ethylamino)pent-3-en-2-onato)Copper(II).

Continuous pure-copper films were successfully deposited on different substrates (Si, Ta, Ru) or structures such as vias or trenches with aspect ratio as high as 8. FIG. 6 is a cross-section SEM image showing conformality of a ~40 nm thick PEALD Cu film. The perpendicular green line marks the boundary between the Cu film and the substrate.

Resistivity provides an indication of film conformality and purity, with higher resistivity indicating poor conformality. Resistivity as low as ~20-25 μΩ·cm were obtained for 20 nm thick copper film produced by the method described above.

Comparative Example

ALD Using bis(4N-(ethylamino)pent-3-en-2-onato) Copper(II)

ALD tests were performed using bis(4N-(ethylamino) pent-3-en-2-onato)Copper(II), which was heated to 90° C. in the delivery vessel and introduced into the reactor chamber with the 1 sccm flow of nitrogen carrier gas. The reactor pressure was around 1 torr. The ALD cycle consisted of 5 second precursor pulse followed by 5 second nitrogen purge followed by 5 second hydrogen pulse (20 sccm hydrogen flow) and 5 second nitrogen purge—in this sequence. The reactor temperature was set to 100° C. No films were deposited on palladium, tantalum nitride, silicon and silicon oxide substrates at these conditions.

Preferred processes and apparatus for practicing the present invention have been described. It will be understood and readily apparent to the skilled artisan that many changes and modifications may be made to the above-described embodiments without departing from the spirit and the scope of the present invention. The foregoing is illustrative only and that other embodiments of the integrated processes and apparatus may be employed without departing from the true scope of the invention defined in the following claims.

What is claimed is:

1. A method of forming a copper-containing film on a substrate by an atomic layer deposition (ALD) process, comprising the steps of:
    a) providing a reactor and at least one substrate disposed therein;
    b) maintaining the reactor at a temperature below 150° C.;
    c) introducing into the reactor a copper-containing precursor having the following formula
    having the following formula:

Compound (I)

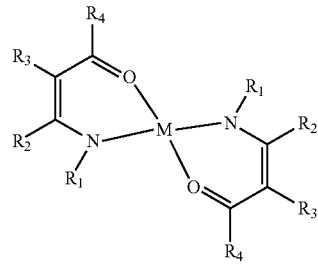

(I)

wherein:
    1) M is Cu; and
    2) each $R^1$, $R^2$, $R^3$, and $R^4$ is independently selected from the group consisting of H, a $C_1$–$C_5$ alkyl, an alkyl amino group, and $Si(R')_3$ where each R' is independently selected from H and a $C_1$-$C_5$ alkyl group;
    d) introducing a co-reactant into the reactor;
    e) treating the co-reactant with a plasma to form a plasma-treated co-reactant; and
    f) reacting the precursor with the plasma-treated co-reactant to form a copper-containing film on the substrate.

2. The method of claim 1, further comprising maintaining the reactor at a pressure between about 0.5 mTorr and about 20 Torr.

3. The method of claim 1, further comprising generating the plasma with a power ranging from about 50 W to about 500 W.

4. The method of claim 1, wherein the step of treating the co-reactant with the plasma occurs prior to the step of introducing the co-reactant into the reactor.

5. The method of claim 1, wherein the co-reactant is selected from the group consisting of $H_2$, $NH_3$, $SiH_4$, $Si_2H_6$, $Si_3H_8$, $SiH_2Me_2$, $SiH_2Et_2$, $N(SiH_3)_3$, and mixtures thereof.

6. The method of claim 1, wherein the copper-containing precursor and the co-reactant are introduced into the chamber sequentially.

7. The method of claim 1, wherein the co-reactant is introduced prior to the copper-containing precursor.

8. The method of claim 1, wherein the precursor is selected from the group consisting of:
    bis(4N-(amino)pent-3-en-2-onato)Copper(II),
    bis(4N-(methylamino)pent-3-en-2-onato)Copper(II),
    bis(4N-(ethylamino)pent-3-en-2-onato)Copper(II),
    bis(4N-(isopropylamino)pent-3-en-2-onato)Copper(II),
    bis(4N-(n-propylamino)pent-3-en-2-onato)Copper(II),
    bis(4N-(n-butylamino)pent-3-en-2-onato)Copper(II),
    bis(4N-(isobutylamino)pent-3-en-2-onato)Copper(II),
    bis(4N-(secbutylamino)pent-3-en-2-onato)Copper(II), and
    bis(4N-(tertbutylamino)pent-3-en-2-onato)Copper(II).

9. The method of claim 1, wherein the precursor is bis(4N-(ethylamino)pent-3-en-2-onato)Copper(II).

10. The method of claim 1, wherein the copper-containing film is formed on the substrate at a rate ranging from 0.1 to 1.0 angstroms/cycle.

* * * * *